United States Patent
Pathak et al.

(10) Patent No.: US 11,643,725 B2
(45) Date of Patent: May 9, 2023

(54) HARDWARE TO PREVENT BOTTOM PURGE INCURSION IN APPLICATION VOLUME AND PROCESS GAS DIFFUSION BELOW HEATER

(71) Applicant: Applied Materials, Inc., Santa Clara, CA (US)

(72) Inventors: Nitin Pathak, Mumbai (IN); Tuan A. Nguyen, San Jose, CA (US); Amit Bansal, Milpitas, CA (US); Badri N. Ramamurthi, Los Gatos, CA (US); Thomas Rubio, Burlingame, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 104 days.

(21) Appl. No.: 17/214,011

(22) Filed: Mar. 26, 2021

(65) Prior Publication Data
US 2022/0307135 A1    Sep. 29, 2022

(51) Int. Cl.
*C23C 16/40*      (2006.01)
*C23C 16/455*    (2006.01)
(Continued)

(52) U.S. Cl.
CPC .... *C23C 16/45559* (2013.01); *C23C 16/4412* (2013.01); *C23C 16/4585* (2013.01); *C23C 16/46* (2013.01)

(58) Field of Classification Search
CPC .......... C23C 16/45559; C23C 16/4412; C23C 16/4585; C23C 16/46; C23C 16/4408
(Continued)

(56) References Cited

U.S. PATENT DOCUMENTS 6,270,859 B2 *  8/2001  Zhao ................. H01J 37/32834
                                                    427/535
10,312,076 B2 *  6/2019  Ghosh ................. C23C 16/4408
(Continued)

FOREIGN PATENT DOCUMENTS

| CN | 111952233 A | 11/2020 |
| JP | 2011171450 A | 9/2011 |
| KR | 20190051291 A | 5/2019 |

OTHER PUBLICATIONS

Application No. PCT/US2022/020865, International Search Report and the Written Opinion, dated Jul. 11, 2022, 12 pages.

*Primary Examiner* — Rudy Zervigon
(74) *Attorney, Agent, or Firm* — Kilpatrick Townsend & Stockton LLP

(57) ABSTRACT

Exemplary semiconductor processing chambers may include a substrate support including a top surface. A peripheral edge region of the top surface may be recessed relative to a medial region of the top surface. The chambers may include a pumping liner disposed about an exterior surface of the substrate support. The chambers may include a liner disposed between the substrate support and the pumping liner. The liner may be spaced apart from the exterior surface to define a purge lumen between the liner and the substrate support. The chambers may include an edge ring seated on the peripheral edge region. The edge ring may extend beyond a peripheral edge of the substrate support and above a portion of the liner. A gap may be formed between a bottom surface of the edge ring and a top surface of the liner. The gap and the purge lumen may be fluidly coupled.

14 Claims, 7 Drawing Sheets

(51) Int. Cl.
*C23C 16/44* (2006.01)
*C23C 16/458* (2006.01)
*C23C 16/46* (2006.01)

(58) Field of Classification Search
USPC ..................................... 118/728; 156/345.51
See application file for complete search history.

(56) References Cited

U.S. PATENT DOCUMENTS

| | | | |
|---|---|---|---|
| 11,276,585 B2* | 3/2022 | Lee | F16K 1/34 |
| 11,492,705 B2* | 11/2022 | Pathak | C23C 16/45565 |
| 2001/0004478 A1* | 6/2001 | Zhao | C23C 16/4412 |
| | | | 427/535 |
| 2007/0215279 A1* | 9/2007 | Koshiishi | H01J 37/32642 |
| | | | 156/914 |
| 2012/0003388 A1* | 1/2012 | Tzu | C23C 16/45565 |
| | | | 118/58 |
| 2013/0247826 A1* | 9/2013 | Tzu | C23C 16/4585 |
| | | | 118/725 |
| 2016/0312359 A1* | 10/2016 | Dubois | H01J 37/32651 |
| 2018/0261453 A1* | 9/2018 | Ghosh | H01L 21/02208 |
| 2019/0122872 A1* | 4/2019 | Ghosh | C23C 16/4408 |
| 2020/0048764 A1* | 2/2020 | Kuwada | H01L 21/68742 |
| 2021/0002763 A1* | 1/2021 | Pathak | C23C 16/4412 |
| 2022/0243322 A1* | 8/2022 | Kim | C23C 16/401 |

* cited by examiner

HARDWARE TO PREVENT BOTTOM PURGE INCURSION IN APPLICATION VOLUME AND PROCESS GAS DIFFUSION BELOW HEATER

TECHNICAL FIELD

The present technology relates to components and apparatuses for semiconductor manufacturing. More specifically, the present technology relates to processing chamber distribution components and other semiconductor processing equipment.

BACKGROUND OF THE INVENTION

During substrate processing operations, such as chemical vapor deposition (CVD) operations, processing gases may diffuse below a top surface of a substrate support. The diffused processing gases result in deposition of material onto outer surfaces of the substrate support and/or other components or surfaces of the substrate processing chamber that are not the substrate. The deposition can delay substrate processing operations, cause production downtime for substrate processing chambers, result in increased cleaning time, reduce throughput, cause non-uniform deposition on the substrate, and/or cause substrate defects.

Thus, there is a need for improved systems and methods that can be used to reduce diffusion of processing gases below the top surface of the substrate support. These and other needs are addressed by the present technology.

BRIEF SUMMARY OF THE INVENTION

Exemplary semiconductor processing chambers may include a substrate support that may include a top surface. A peripheral edge region of the top surface may be recessed relative to a medial region of the top surface. The semiconductor processing chambers may include a pumping liner disposed about an exterior surface of the substrate support. The semiconductor processing chambers may include a liner disposed between the substrate support and the pumping liner. The liner may be spaced apart from the exterior surface of the substrate support to define a purge lumen between the liner and the substrate support. The semiconductor processing chambers may include an edge ring seated on the peripheral edge region of the substrate support. The edge ring may extend beyond a peripheral edge of the substrate support and above at least a portion of the liner. A gap may be formed between a bottom surface of the edge ring and a top surface of the liner. The gap and the purge lumen may be fluidly coupled with one another.

In some embodiments, one or both of an inner edge and an outer edge of the top surface of the liner may be rounded. A top surface of the edge ring and the medial region of the top surface of the substrate support may be at a substantially same height when the substrate support is in a process position. The gap may separate the bottom surface of the edge ring and the top surface of the liner by a vertical distance of between about 80 mils and 300 mils. A distal edge of the edge ring may extend radially outward beyond at least half of a thickness of the liner. An inner surface of the liner may include a protrusion that extends inward toward the exterior surface of the substrate support. A lateral distance between the exterior surface of the substrate support and the protrusion may be between about 60 mils and 100 mils. The liner may include a ceramic material.

Some embodiments of the present technology may also encompass semiconductor processing chambers. The semiconductor processing chambers may include a showerhead that at least partially defines a top of the chamber. The showerhead may define a plurality of apertures that extend through a thickness of the showerhead. The semiconductor processing chambers may include a substrate support disposed beneath the showerhead. The substrate support may include a top surface. A peripheral edge region of the top surface may be recessed relative to a medial region of the top surface. The substrate may be vertically translatable within the chamber between a process position and a transfer position. The semiconductor processing chambers may include a liner disposed laterally outward of and spaced apart from an exterior surface of the substrate support to define a purge lumen between the liner and the substrate support. The semiconductor processing chambers may include an edge ring seated on the peripheral edge region of the substrate support when the substrate support is in the process position, the edge ring extending beyond a peripheral edge of the substrate support and above at least a portion of the liner. A gap may be formed between a bottom surface of the edge ring and a top surface of the liner. The gap and the purge lumen may be fluidly coupled with one another.

In some embodiments, the edge ring may be seated on the top surface of the liner when the substrate support is in the transfer position. A top surface of the edge ring and the medial region of the top surface of the substrate support may be at a substantially same height when the substrate support is in the process position. The gap may separate the bottom surface of the edge ring and the top surface of the liner by a vertical distance of between about 80 mils and 300 mils. The semiconductor processing chambers may include a pumping liner radially outward of the liner. One or both of an inner edge and an outer edge of the top surface of the liner may be chamfered. The semiconductor processing chambers may include a purge gas source coupled with a bottom of the purge lumen.

Some embodiments of the present technology may also encompass methods of processing a semiconductor substrate. The methods may include flowing a precursor into a semiconductor processing chamber via a showerhead that is disposed above a substrate support on which the semiconductor substrate is positioned. The methods may include simultaneously flowing a purge gas through a purge lumen defined by an exterior surface of the substrate support and a liner that is spaced apart from the substrate support. The methods may include diverting the purge gas laterally outward using an edge ring that is positioned atop a peripheral edge of the substrate support and that extends laterally outward of a top end of the purge channel such that the purge gas and the precursor diffuse with one another at a diffusion position that is radially outward of a bevel of the semiconductor substrate.

In some embodiments, the methods may include choking the flow of the purge gas within one or both of the purge lumen and a gap formed between a bottom surface of the edge ring and a top surface of the liner. A gap formed between a bottom surface of the edge ring and a top surface of the liner may separate the bottom surface of the edge ring and the top surface of the liner by a vertical distance of between about 80 mils and 300 mils. The methods may include venting the precursor and the purge gas out of the semiconductor chamber via a pumping liner that is disposed proximate the diffusion position.

Such technology may provide numerous benefits over conventional systems and techniques. For example, the processing systems may provide multi-substrate processing capabilities that may be scaled well beyond conventional designs. Additionally, each chamber system may include an edge ring that ensures that process gases and purge gases diffuse with one another at positions that are remote from the substrate and the substrate support. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
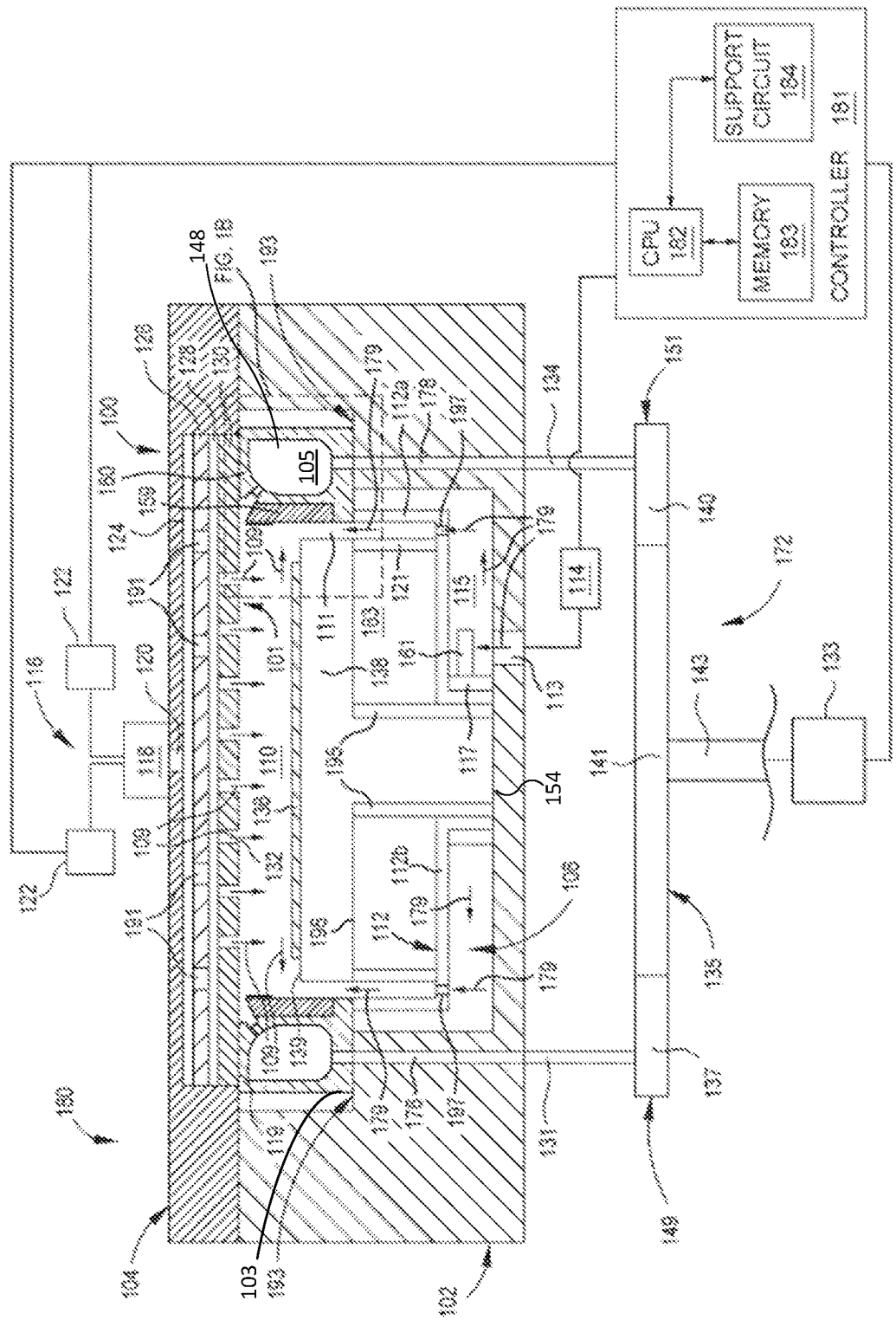
FIG. 1 shows a schematic cross-sectional view of a substrate processing chamber according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

Substrate processing operations may include delivering process gases to a substrate support to deposit film on a wafer or other substrate. The diffusion of process gases within a processing chamber may result in deposition of material not only on the wafer, but also on surfaces of the substrate support. For example, residue may be deposited on lateral exterior surfaces of the substrate support, which may be difficult to clean. This residue may delay substrate processing operations, cause production downtime for substrate processing chambers, result in increased cleaning time, reduce throughput, cause non-uniform deposition on the substrate, and/or cause substrate defects.

Conventional systems may attempt to prevent the formation of residue on the substrate support and/or other chamber components through the use of a bottom purge gas flow, which may obstruct the flow of process gases at areas near the chamber components. However, it is very difficult to perfectly balance the flow rates of the process gases and purge gases to provide the diffusion or mixing position of the purge and process gases at the interface of the edge of the wafer and the substrate support. This results in processing issues. For example, if purge gas reaches a bevel and/or other edge portion of the wafer there may be film uniformity issues across the surface of the wafer. If the process gases reach the lateral exterior surfaces of the substrate support there will be residue formation on the substrate.

The present technology overcomes these challenges by utilizing edge rings that divert flow of both the process gas and the purge gas outward away from both the wafer and the substrate support. This moves the diffusion position away from the wafer and the substrate support and ensures that the wafer is isolated from purge gas and the lateral exterior surface of the substrate support is isolated from process gases.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include pedestals according to embodiments of the present technology before additional variations and adjustments to this system according to embodiments of the present technology are described.

FIG. 1A shows a schematic cross-sectional view of an exemplary substrate processing chamber 100, according to one implementation. The substrate processing chamber 100 may be, for example, a chemical vapor deposition (CVD) chamber or a plasma enhanced CVD chamber. The present disclosure contemplates that other chambers may be used, such as an atomic layer deposition (ALD) chamber or a physical vapor deposition (PVD) chamber. The substrate processing chamber 100 may have a chamber body 102 and a chamber lid 104 disposed on the chamber body 102. The chamber body 102 may define an internal volume 106 between one or more sidewalls and a base of the chamber body 102 and the chamber lid 104. The chamber body 102 may be made of a single body, or two or more bodies.

The substrate processing chamber 100 may include a gas distribution assembly 116 coupled to or disposed in the chamber lid 104 to deliver a flow of one or more process gases 109 into a processing region 110 through a showerhead 101. The one or more process gases may include one or more of Ar and/or $C_3H_6$, among other gases. In one example, the one or more process gases may include one or more reactive gases. The showerhead 101 may include a backing plate 126 and a faceplate 130. The gas distribution assembly 116 may include a gas manifold 118 coupled to a gas inlet passage 120 formed in the chamber lid 104. The gas manifold 118 may receive a flow of one or more processing gases from one or more gas sources 122. While two gas sources 122 are shown, any number of gas sources may be provided in various embodiments. The flow of processing gases received from the one or more gas sources 122 may distribute across a gas box 124, flow through a plurality of openings 191 of the backing plate 126, and further distribute across a plenum 128 defined by the backing plate 126 and the faceplate 130. The flow of processing gases 109 may then flow into a processing region 110 of the internal volume 106 through one or more gas openings 132 formed in a lower surface 119 of the faceplate 130 of the showerhead 101.

A substrate support 138 may be disposed within internal volume 106 defined by the chamber body 102. The substrate supports 138 may be pedestals as illustrated, although a number of other configurations may also be used. The substrate support 138 may support a substrate 136 within the substrate processing chamber 100. The substrate support 138 may support the substrate 136 on a support surface 139 of the substrate support 138. The substrate support 138 may include a heater and/or an electrode disposed therein. The electrode may receive direct current (DC) voltage, radio frequency (RF) energy, and/or alternating current (AC) energy to facilitate processing. The lower surface 119 of the faceplate 130 of the showerhead 101 may face the support surface 139 of the substrate support 138. The support surface 139 may face the lower surface 119 of the faceplate 130 of the showerhead 101. The substrate support 138 may be made of a single body, or two or more bodies.

The substrate support 138 may be movably disposed in the internal volume 106 by a lift system 195. Movement of the substrate support 138 may facilitate transfer of the substrate 136 to and from the internal volume 106 through a slit valve formed through the chamber body 102. The substrate support 138 may also be moved to different processing positions for processing of the substrate 136.

During substrate processing, as process gases (such as the process gases 109) flow into the processing region 110, a heater may heat the substrate support 138 and the support surface 139. Also during substrate processing, the electrode in the substrate support 138 may propagate radio frequency (RF) energy, alternating current (AC), or direct current (DC) voltage to facilitate plasma generation in the processing region 110 and/or to facilitate chucking of the substrate 136 to the substrate support 138. The heat, gases, and energy from the electrode in the substrate support 138 may facilitate deposition of a film onto the substrate 136 during substrate processing. The faceplate 130, which may be grounded via coupling to the chamber body 102, and the electrode of the substrate support 138, may facilitate formation of a capacitive plasma coupling. When power is supplied to the electrode in the substrate support 138, an electric field may be generated between the faceplate 130 and substrate support 138 such that atoms of gases present in the processing region 110 between the substrate support 138 and the faceplate 130 are ionized and release electrons. The ionized atoms accelerate to the substrate support 138 to facilitate film formation on the substrate 136.

A pumping device 103 may be disposed in the substrate processing chamber 100. The pumping device 103 may facilitate removal of gases from the internal volume 106 and processing region 110. The gases exhausted by the pumping device 103 may include one or more of a process gas and a process residue. The process residue may result from the process of depositing a film onto the substrate 136.

The pumping device 103 may include a pumping liner 160 disposed on the chamber body 102. For example, the pumping liner 160 may be seated on a stepped surface 193 of the chamber body 102 and a liner 159 may be disposed between the substrate support 138 and the pumping liner 160. The stepped surface 193 may be stepped upwards from a bottom surface 154 of the chamber body 102. The pumping liner 160 may be made of a single body, or two or more bodies. The pumping liner 160 may be made from material including one or more of aluminum, aluminum oxide, and/or aluminum nitride. The liner 159 may be made from an electrically isolating material, such as a ceramic material. In one example, the liner 159 may be made of one or more of quartz, a ceramic material including aluminum such as aluminum oxide and/or aluminum nitride, or any other suitable material. The pumping liner 160 may be disposed around the substrate support 138 and may encircle the substrate support 138. A portion of a purge gas flow path 111 may be defined by an inner surface of the liner 159 and a lateral exterior surface of the substrate support 138. The substrate processing chamber 100 may include a purge gas inlet 113 disposed at a bottom of the chamber body 102. The purge gas inlet 113 may be an opening formed in a bottom surface of the chamber body 102. The purge gas inlet 113 may be fluidly coupled with a purge gas source 114 that supplies one or more purge gases 179 to the purge gas inlet 113. A bowl 112 may be disposed in the internal volume 106. The bowl 112 may define a purge gas volume 115. One or more bellows 117 may be disposed in the purge gas volume 115. One or more purge gas baffles 161 may be disposed in the purge gas volume 115. One or more bellows 121 may be disposed above a horizontal portion 112b of the bowl 112 and below a bottom surface 198 of the substrate support 138. The one or more bellows 121 may separate a dead volume 163 from a portion of the purge gas flow path 111 that is between the one or more bellows 121 and a vertical portion 112a of the bowl 112.

During substrate processing operations, and while processing gases 109 flow into the processing region 110 from the showerhead 101, the purge gas inlet 113 may flow the one or more purge gases 179 into the purge gas volume 115. The horizontal portion 112b of the bowl 112 may include one or more purge gas openings 197 that flow the purge gases 179 from the purge gas volume 115 and into the purge gas flow path 111. The one or more purge gas openings 197 may be disposed radially outwardly of the one or more bellows 121. While the processing gases 109 flow toward the substrate 136 to deposit films on the substrate 136, the purge gases 179 may flow upwards in the purge gas flow path 111 to prevent the processing gases 109 from diffusing downwards into the purge gas flow path 111. The processing gases 109 and the purge gases 179 may meet and/or mix at a diffusion position that is proximate the support surface 139. The processing gases 109 and the purge gases 179 may mix to form a gas mixture 148 that is exhausted by the pumping device 103. The pumping device 103 may include the pumping liner 160 and the liner 159.

The one or more purge gases 179 may include one or more inert gases, such as one or more of Ar and/or N2. The one or more process gases 109 may flow into the processing region 110 from the showerhead 101 at a first flow rate. In one example, the first flow rate may be a volumetric flow rate having units of standard cubic centimeters per minute (SCCM). The one or more purge gases 179 may flow into the purge gas volume 115 from the purge gas inlet 113 at a second flow rate. In one example, the second flow rate may be a volumetric flow rate having units of SCCM. The second flow rate may be a ratio R1 relative to the first flow rate. For example, the ratio R1 may be within a range of 0.25 to 0.75 of the first flow rate, within a range of 0.25 to 0.50 of the first flow rate, or within a range of 0.48 to 0.52. In one embodiment, which can be combined with other embodiments, the ratio R1 may be about 0.25, 0.30, 0.40, or 0.5 of the first flow rate. The ranges and examples of the ratio R1 of the second flow rate relative to the first flow rate may incur benefits such as preventing at least a portion of processing gases from diffusing into the purge gas flow path 111 below the support surface 139 during substrate processing operations. Reducing or preventing such diffusion reduces or eliminates the likelihood that processing gases 109 will deposit materials onto surfaces other than the substrate 136. Reducing deposition on surfaces other than the substrate 136 reduces or eliminates delays, throughput reductions, operational costs, cleaning time, and/or substrate defects.

The substrate processing chamber 100 may be part of a substrate processing system 180 that includes a controller 181 coupled to the substrate processing chamber 100. The controller 181 may be part of a non-transitory computer readable medium.

The controller 181 may control aspects of the substrate processing chamber 100 during substrate processing. The controller 181 include a central processing unit (CPU) 182, a memory 183, and a support circuit 184 for the CPU 182. The controller 181 may facilitate control of the components of the substrate processing chamber 100. The controller 181 may be a computer that can be used in an industrial setting for controlling various chamber components and sub-processors. The memory 183 may store instructions, such as software (source code or object code), that may be executed or invoked to control the overall operations of the substrate processing chamber 100 in manners described herein. The controller 181 may manipulate respective operations of controllable components in the substrate processing chamber 100. For example, the controller 181 may control the operations of the gas sources 122 to introduce processing gases, the purge gas source 114 to introduce purge gases, and/or a vacuum pump 133 (described below) to exhaust gases to eliminate or reduce contaminant particles (such as residue) in the substrate processing chamber. As an example, the controller 181 may control the lift system 195 to raise and lower the substrate support 138, and the heater and the electrode of the substrate support 138 to supply heat and energy to facilitate processing.

The pumping liner 160 may be fluidly coupled to a foreline 172 through a first conduit 176 and a second conduit 178. The foreline 172 may include a first vertical conduit 131, a second vertical conduit 134, a horizontal conduit 135, and an exit conduit 143. The exit conduit 143, in one example, is a third vertical conduit. In one example, the first conduit 176 and the second conduit 178 may be openings formed in the chamber body 102. The first conduit 176 and/or the second conduit 178 may be tubes or other flow devices that extend between a surface of the chamber body 102, such as bottom surface 154, and the pumping liner 160. As an example, the first conduit 176 and/or the second conduit 178 may be part of the first vertical conduit 131 and the second vertical conduit 134, respectively. In such an example, the first vertical conduit 131 and the second vertical conduit 134 may extend through the chamber body 102 and be coupled to the pumping liner 160. In one embodiment, which can be combined with other embodiments, the first conduit 176 and the second conduit 178 each may be an opening formed in one or more sidewalls of the chamber body 102.

The first conduit 176 may be fluidly coupled to the pumping liner 160 and the first vertical conduit 131 of the foreline 172. The second conduit 178 may be fluidly coupled to the pumping liner 160 and the second vertical conduit 134 of the foreline 172. The first vertical conduit 131 and the second vertical conduit 134 may be fluidly coupled to the horizontal conduit 135. The horizontal conduit 135 may include a first portion 137 coupled to the first vertical conduit 131, a second portion 140 coupled to the second vertical conduit 134, and a third portion 141 coupled to the exit conduit 143. The horizontal conduit 135 may include a first end 149 adjacent to the first vertical conduit 131 and a second end 151 adjacent to the second vertical conduit 134. The horizontal conduit 135 may be made up of a single body or can be fabricated from one or more components.

The first conduit 176, second conduit 178, first vertical conduit 131, second vertical conduit 134, and horizontal conduit 135 may be configured to direct gases therethrough. The first conduit 176, second conduit 178, first vertical conduit 131 and/or second vertical conduit 134 need not be completely vertical and may be angled or may include one or more bends and/or angles. The present horizontal conduit 135 need not be completely horizontal and may be angled or may include one or more bends and/or angles.

The exit conduit 143 may be fluidly coupled to a vacuum pump 133 to control the pressure within the processing region 110 and to exhaust gases and residue from the processing region 110. The vacuum pump 133 may exhaust gases from the processing region 110 through the pumping liner 160, the first conduit 176, the second conduit 178, the first vertical conduit 131, the second vertical conduit 134, the horizontal conduit 135, and the exit conduit 143 of the foreline 172.

The pumping liner 160 may be fluidly coupled to the exit conduit 143 through the second conduit 178, second vertical conduit 134 and the horizontal conduit 135. The gas mixture 148 may flow from the annulus 105, through the exhaust port 145, and into the second conduit 178. A second exhaust port of the pumping liner 160 may be disposed between the annulus 105 and the first conduit 176. The second exhaust port may be fluidly coupled to the exit conduit 143 through the first conduit 176, first vertical conduit 131 and the horizontal conduit 135. In addition to flowing through the exhaust port 145, the gas mixture 148 may flow through the second exhaust port and into the first conduit 176.

The first vertical conduit 131 may flow the gas mixture 148 from the first conduit 176 and into the first portion 137 of the horizontal conduit 135. The second vertical conduit 134 may flow the gas mixture 148 from the second conduit 178 and into the second portion 140 of the horizontal conduit 135. The first portion 137 and the second portion of the horizontal conduit 135 may flow the gas mixture 148 from the first vertical conduit 131 and the second vertical conduit 134, respectively, and into the third portion 141 of the horizontal conduit 135. The third portion 141 of the horizontal conduit 135 may flow the gas mixture 148 from the horizontal conduit 135 and into the exit conduit 143. The exit conduit 143 may exhaust the gas mixture 148 from the exhaust port 145 and the second exhaust port that is disposed between the annulus 105 and the first conduit 176.

Although two conduits 176, 178; two vertical conduits 131, 134; and a pumping liner 160 with an exhaust port 145 and a second exhaust port are illustrated, any number of conduits, vertical conduits, and/or exhaust ports may be implemented in various embodiments. For example, the pumping liner 160 may have at least three exhaust ports that are fluidly coupled to respective conduits and vertical conduits. The third conduit may be coupled to the third vertical conduit and the third vertical conduit may be coupled to the horizontal conduit 135. The three exhaust ports may be disposed along a circumferential axis of the pumping liner 160 approximately equidistant from each other, such as 120 degrees from each other.

Figure 2A:
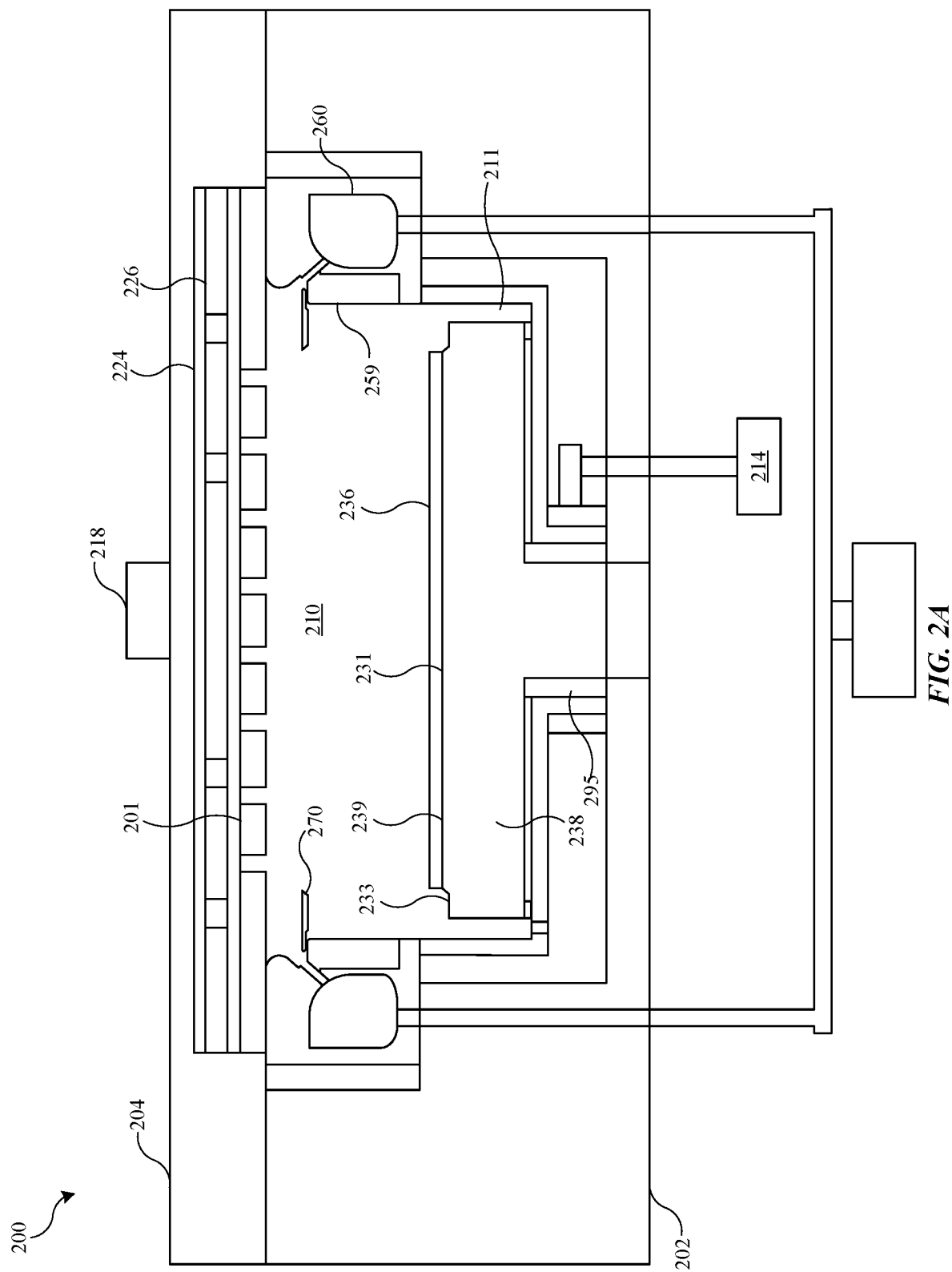
FIG. 2A shows a schematic cross-sectional view of a substrate processing chamber with a substrate support in a transfer position according to some embodiments of the present technology.

FIG. 2A shows a schematic partial cross-sectional view of an exemplary semiconductor processing chamber 200 according to some embodiments of the present technology. FIG. 2A may include one or more components discussed above with regard to FIG. 1, and may illustrate further details relating to that chamber. Chamber 200 is understood to include any feature or aspect of chamber 100 discussed previously in some embodiments. The chamber 200 may be used to perform semiconductor processing operations including deposition of hardmask materials as previously described, as well as other deposition, removal, and cleaning operations. Chamber 200 may show a partial view of a processing region of a semiconductor processing system, and may not include all of the components, and which are understood to be incorporated in some embodiments of chamber 200.

As noted, FIG. 2A may illustrate a portion of a processing chamber 200. The chamber 200 may include a number of lid stack components, which may facilitate delivery or distribution of materials through the processing chamber 200 into a processing region 210. A chamber lid plate 204 may extend across one or more plates of the lid stack and may provide structural support for various components, such as an output manifold 218. Chamber 200 may include a chamber body 202, a gas box 224, a backing plate 226, and a showerhead 201.

Chamber 200 may include a substrate support 238, which may include a support surface 239 on which a substrate 236 may be supported. The support surface 239 may include a medial region 231 that defines substrate seat and a peripheral edge region 233. A top surface of the peripheral edge region 233 may be recessed and/or otherwise lower than a top surface of the medial region 231. The substrate support 238 may include a heater and/or an electrode disposed therein. The electrode may receive direct current (DC) voltage, radio frequency (RF) energy, and/or alternating current (AC) energy to facilitate processing. The substrate support 238 may be vertically translatable along a central axis of the substrate support 238 between a transfer position as illustrated, and a process position. For example, a lift system 295 may be used to raise and lower the substrate support 238 between the transfer position and one or more process positions. In the transfer position, substrates 236 may be transferred to and from the substrate support 238 via a slit valve formed through the chamber body 202.

A pumping liner 260 may be disposed about an exterior surface of the substrate support 238. A liner 259 may be disposed between the substrate support 238 and the pumping liner 260. For example, an outer surface of the liner 259 may be positioned against an inner surface of the pumping liner 260, with an inner surface of the liner 259 being spaced apart from the exterior surface of the substrate support 238. The exterior surface of the substrate support 238 and the inner surface of the liner 259 may define a gap that operates as a purge lumen 211, which may be coupled with a purge gas source 214. The liner 259 may be made from an electrically isolating material, such as a ceramic material. In one example, the liner 259 may be made of quartz, a ceramic material including aluminum such as aluminum oxide and/or aluminum nitride, and/or any other suitable material. The top inner edge and/or the top outer edge of the liner 259 may be rounded and/or chamfered, which may help reduce or eliminate surface singularities that may create flow separation and/or otherwise impact flow uniformity through the purge lumen 211.

Figure 2B:
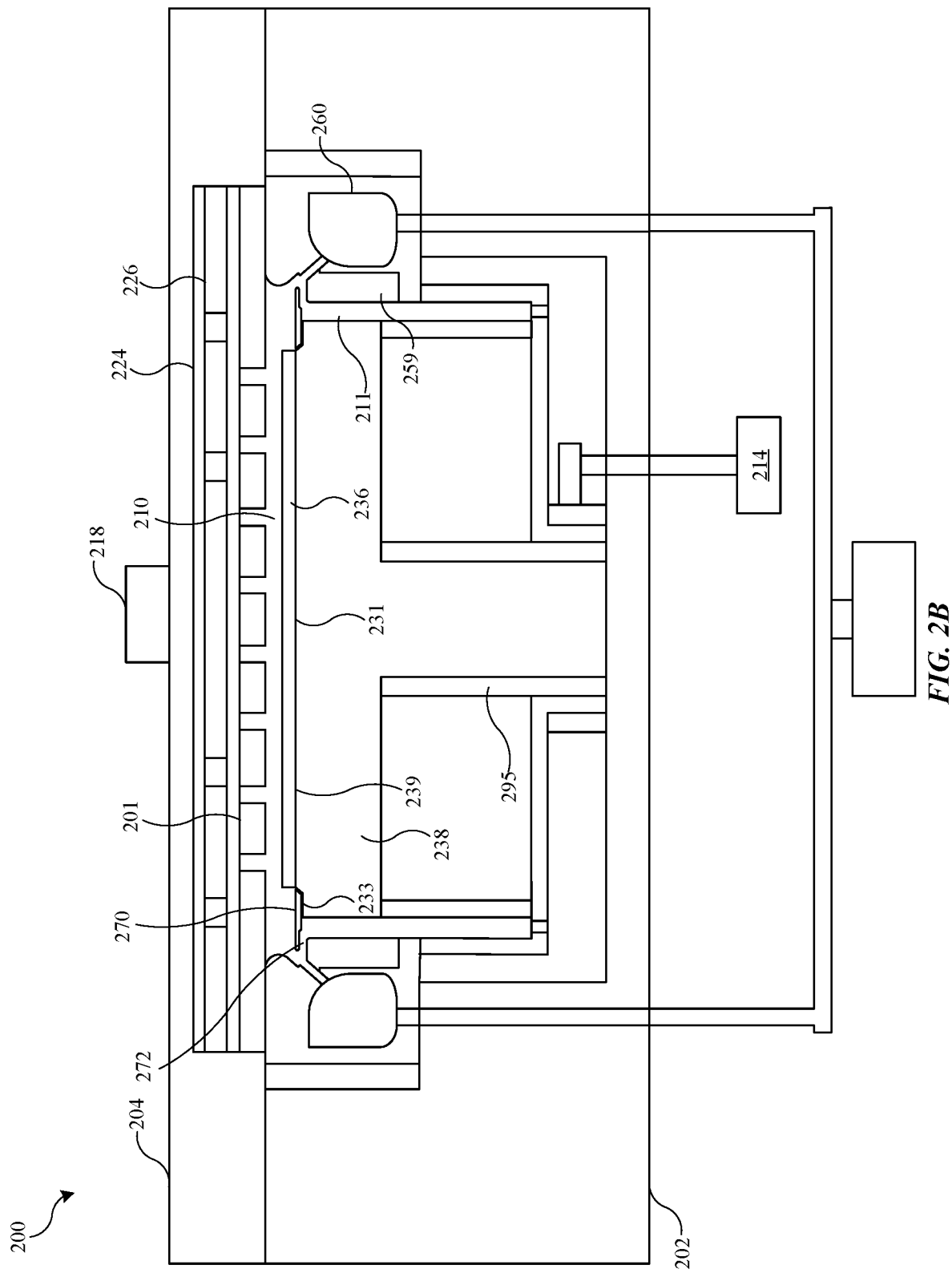
FIG. 2B shows a schematic cross-sectional view of the substrate processing chamber of FIG. 2A with the substrate support in a process position according to some embodiments of the present technology.

Chamber 200 may include an edge ring 270 that is positioned radially outward of the medial region 231 of the support surface 239. For example, an inner portion of the edge ring 270 may be vertically aligned with the peripheral edge region 233 of the support surface 239, while an outer portion of the edge ring 270 is in vertical alignment with at least a portion of the liner 259. A medial portion of the edge ring 270 may extend over the purge lumen 211. When the substrate support 238 is in the transfer position as shown in FIG. 2A, outer portion of the edge ring 270 may be seated on a top surface of the liner 259, and the edge ring 270. As the substrate support 238 is raised to the process position using the lift system 295, the peripheral edge region 233 of the support surface 239 contacts the inner portion of the edge ring 270 and lifts the edge ring 270 off of the top surface of the liner 259. As shown in FIG. 2B, in the process position the edge ring 270 is seated on the peripheral edge region 233 of the support surface 239, with the outer portion of the edge ring 270 extending beyond the peripheral edge of the substrate support 238 and above at least a portion of the liner 259 such that a gap 272 is formed between a bottom surface of the edge ring 270 and a top surface of the liner 259. The gap 272 may be fluidly coupled with the purge lumen 211.

Figure 2C:
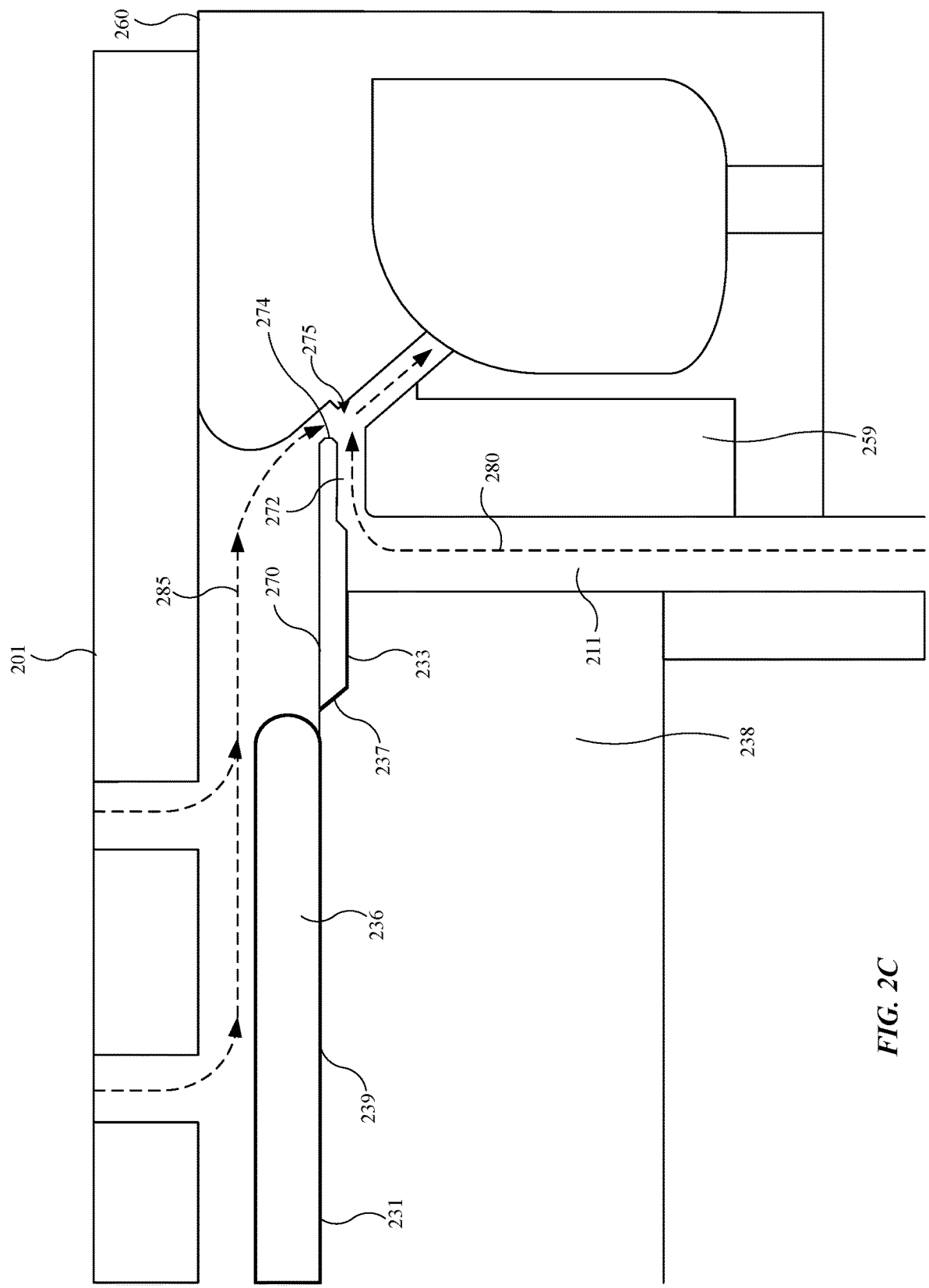
FIG. 2C shows an enlarged schematic partial cross-sectional view of the substrate processing chamber of FIG. 2A according to some embodiments of the present technology.

FIG. 2C illustrates a schematic partial cross-sectional view of the edge ring 270 seated on the peripheral edge region 233 of the support surface 239 while the substrate support 238 is in the process position. In this position, a top surface of the edge ring 270 may be at a same height or at a substantially same height as a top surface of the medial region 231 of the support surface 239. For example, the edge ring 270 may have a thickness that is equal or substantially equal to a distance between top surfaces of the medial region 231 and the peripheral edge region 233 of the support surface 239. This arrangement may help prevent the formation of any eddies, other circulation, and/or other changes in flow pattern of process gases from the showerhead 201 near the edge of the substrate 236 that could affect film deposition on the substrate 236. As used herein, the term substantially may be understood to mean within or about 10%, within or about 5%, within or about 3%, within or about 1%, or less. The edge ring 270 may be positioned on the peripheral edge region 233 with an inner edge of the edge ring 270 abutting a transition area 237 formed between the medial region 231 and the peripheral edge region 233 such that no gap exists between the edge ring 270 and the transition area 237. The transition area 237 may be tapered as shown here, or may be in the form of a vertical step. The inner portion and/or medial portion of the edge ring 270 may be thicker than an outer portion of the edge ring 270, which may better facilitate formation of the gap 272 between the bottom surface of the edge ring 270 and the top surface of the liner 259. A transition between the thicker portion and the thinner portion of the edge ring 270 may be tapered and/or stepped.

The medial portion of the edge ring 270 extends over the top of the purge lumen 211 and a distal edge 274 of the edge ring 270 extends radially outward over the liner 259. For example, the distal edge 274 may extend beyond at least or about 10% of a thickness of the liner 259, at least or about 20% of the thickness of the liner 259, at least or about 30% of the thickness of the liner 259, at least or about 40% of the thickness of the liner 259, at least or about 50% of the thickness of the liner 259, at least or about 60% of the thickness of the liner 259, at least or about 70% of the thickness of the liner 259, or more. Such positioning of the edge ring 270 may force purge gases from the purge lumen 211 to flow radially outward through the gap 272 and towards the pumping liner 260 as shown by arrow 280, while the process gases from the showerhead 201 flow outward toward the pumping liner 260 between the showerhead 201 and the top surface of the edge ring 270 as shown by arrow 285. This may move a diffusion position 275 (where the purge gas and process gases mix) radially outward and away from the substrate 236 and substrate support 238. By moving the diffusion position 275 away from the substrate support 238, the flow of purge gas through purge lumen 211 and gap 272 may prevent process gases from contacting lateral sides of the substrate support and may thereby prevent any film residue from accumulating on such surfaces. Similarly, the outward-disposed diffusion position 275 may enable the flow of process gases to prevent purge gases from reaching the substrate 236 to ensure that better film uniformity on the substrate 236 is achieved.

A size of the purge lumen 211 and/or gap 272 may be selected to further alter the location of the diffusion position 275 to ensure that the process gases do not reach the lateral exterior surface of the substrate support 238. For example, the liner 259 may be spaced apart from the exterior surface of the substrate support 238 to form a purge lumen 211 having a width of between or about 20 mils and 600 mils, between or about 40 mils and 500 mils, between or about 60 mils and 300 mils, or between or about 80 mils and 200 mils, with a thinner purge lumen 211 leading to higher localized purge gas flow velocities that prevent process gases from entering the gap 272 and/or purge lumen 211 and reaching the lateral exterior surface of the substrate support 238. Similar effects may be achieved by adjusting a height of the liner 259 relative to the bottom surface of the edge ring 270 to adjust a size of gap 272. For example, the gap 272 may separate the bottom surface of the edge ring and the top surface of the liner by a vertical distance of between or about 80 mils and 300 mils, between or about 100 mils and 250 mils, or between or about 120 mils and 200 mils, with a smaller gap 272 leading to higher localized purge gas flow velocities that prevent process gases from entering the gap 272 and/or purge lumen 211.

Figure 2D:
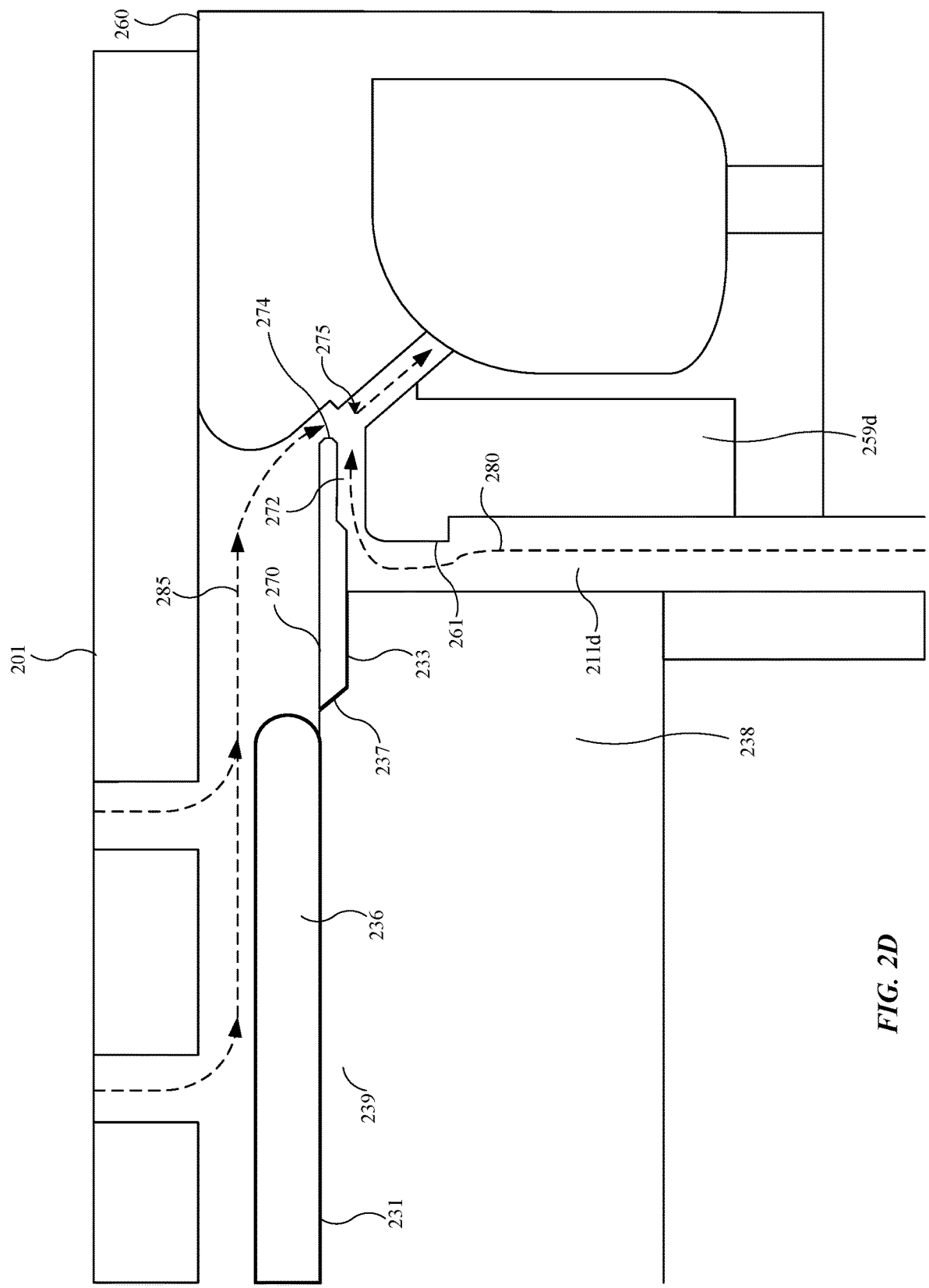
FIG. 2D shows an enlarged schematic partial cross-sectional view of the substrate processing chamber of FIG. 2A according to some embodiments of the present technology.
Figure 2E:
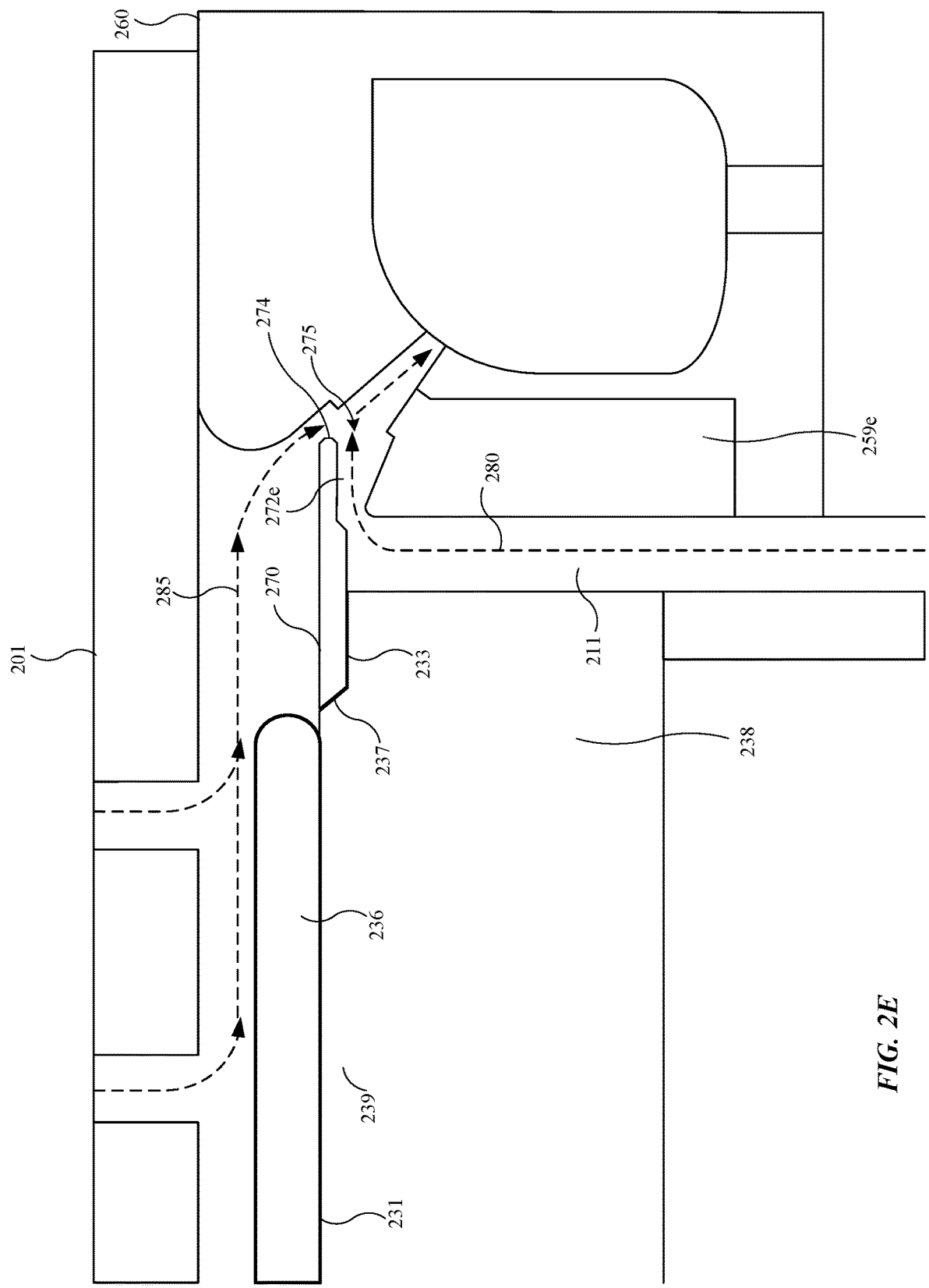
FIG. 2E shows an enlarged schematic partial cross-sectional view of the substrate processing chamber of FIG. 2A according to some embodiments of the present technology.

A size of the gap 272 and/or purge lumen 211 may be constant or substantially contestant as shown here. In some embodiments, a design of the liner 259 may be adjusted to create a purge gas flow path with a variable cross-section at one or more locations. For example, FIG. 2D illustrates a schematic partial cross-sectional view of chamber 200 with a liner 259d. Liner 259d may be similar to liner 259, but may include a protrusion 261 that is formed on an inner surface of the liner 259d. For example, the protrusion 261 may extend inward to the exterior surface of the substrate support 238, which may narrow a width of the purge lumen 211d and create a choke point that increases the localized purge gas flow velocity. For example, a lateral distance between the exterior surface of the substrate support 238 and the protrusion 261 may be between or about 60 mils and 100 mils, between or about 70 mils and 90 mils, or about 80 mils. FIG. 2E illustrates a schematic partial cross-sectional view of chamber 200 with a liner 259e. Liner 259e may be similar to liner 259, but may include a top surface that tapers and/or otherwise slopes downward in an outward direction toward the pumping liner 260. This may create a gap 272e having an increasing cross-section in a downstream direction toward the pumping liner 260, which may alter the diffusion position 275. It will be appreciated that other variations in liner designs may be utilized to adjust the flow characteristics of the purge gas to create a diffusion position 275 that isolates the substrate 236 from purge gas flow and isolates the lateral exterior surface of the substrate support 238 from process gas flow.

Figure 3:
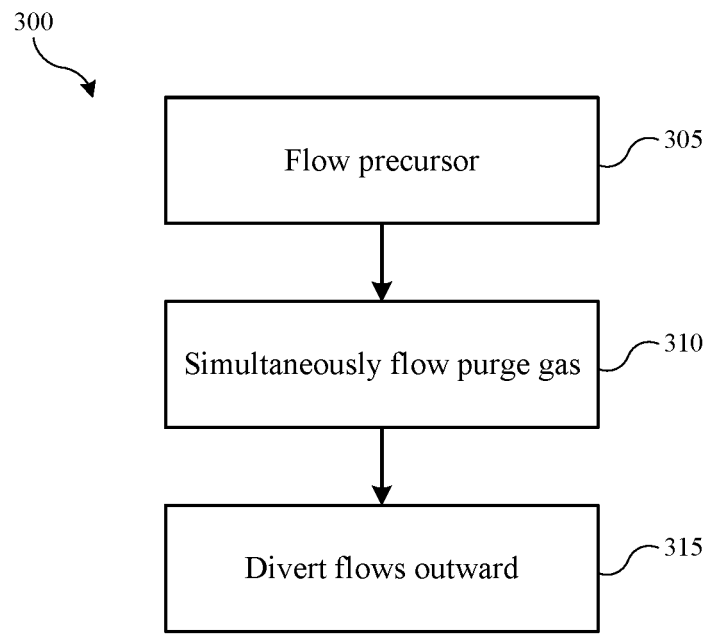
FIG. 3 shows operations of an exemplary method of processing a semiconductor substrate according to some embodiments of the present technology.

FIG. 3 shows operations of an exemplary method 300 of semiconductor processing according to some embodiments of the present technology. The method 300 may be performed in a variety of processing chambers, including processing chambers 100 and 200 described above, which may include edge rings and liners according to embodiments of the present technology, such as edge ring 270 and liner 259. Method 300 may include a number of optional operations, which may or may not be specifically associated with some embodiments of methods according to the present technology.

Method 300 may include a processing method that may include operations for forming a hardmask film or other deposition operations. The method may include optional operations prior to initiation of method 300, or the method may include additional operations. For example, method 300 may include operations performed in different orders than illustrated. In some embodiments, method 300 may include flowing a precursor into a semiconductor processing chamber via a showerhead that is disposed above a substrate support on which the semiconductor substrate is positioned at operation 305. The method 300 may include simultaneously flowing a purge gas through a purge lumen defined by an exterior surface of the substrate support and a liner that is spaced apart from the substrate support at operation 310. The method 300 may include diverting the purge gas laterally outward using an edge ring that is positioned atop a peripheral edge of the substrate support and that extends laterally outward of a top end of the purge channel such that the purge gas and the precursor diffuse with one another at a diffusion position that is radially outward of a bevel of the semiconductor substrate at operation 315. The diffusion position may be selected such that purge gas is prevented from reaching the substrate by the flow or process gas from the showerhead and such that the process gas is prevented from reaching the lateral exterior surface of the substrate support by the flow of purge gas. This helps ensure that better film uniformity is achieved on the substrate, while eliminating film residue from forming on the lateral exterior surface of the substrate support.

In some embodiments, the method 300 may include choking the flow of the purge gas within the purge lumen and/or a gap formed between a bottom surface of the edge ring and a top surface of the liner. For example, the liner may be designed and/or positioned to create one or more choke points that increase the localized purge gas flow velocity to help push the diffusion point radially outward. The method may include venting the precursor and the purge gas out of the semiconductor chamber via a pumping liner that is disposed proximate the diffusion position. A gap formed between a bottom surface of the edge ring and a top surface of the liner separates the bottom surface of the edge ring and the top surface of the liner by a vertical distance of between about 80 mils and 300 mils.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s) ", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing chamber, comprising: a substrate support comprising a support surface, wherein a peripheral edge region of the support surface is recessed relative to a medial region of the support surface; a pumping liner disposed about an exterior surface of the substrate support; a liner disposed between the substrate support and the pumping liner, wherein the liner is spaced apart from the exterior surface of the substrate support to define a purge lumen between the liner and the substrate support; wherein an inner surface of the liner comprises a protrusion that extends inward toward the exterior surface of the substrate support; a lateral distance between the exterior surface of the substrate support and the protrusion is between about 60 mils and 100 mils; and an edge ring seated on the peripheral edge region of the support surface, the edge ring extending beyond a peripheral edge of the substrate support and above at least a portion of the liner, wherein: a gap is formed between a bottom surface of the edge ring and a top surface of the liner; and the gap and the purge lumen are fluidly coupled with one another.

2. The semiconductor processing chamber of claim 1, wherein:
one or both of an inner edge and an outer edge of the top surface of the liner are rounded.

3. The semiconductor processing chamber of claim 1, wherein:
a top surface of the edge ring and a top surface of the medial region of the support surface of the substrate support are at a substantially same height when the substrate support is in a process position.

4. The semiconductor processing chamber of claim 1, wherein:
the gap separates the bottom surface of the edge ring and the top surface of the liner by a vertical distance of between about 80 mils and 300 mils.

5. The semiconductor processing chamber of claim 1, wherein:
a distal edge of the edge ring extends radially outward beyond at least half of a thickness of the liner.

6. The semiconductor processing chamber of claim 1, wherein:
the top surface of the liner tapers downward in a direction of the pumping liner.

7. The semiconductor processing chamber of claim 1, wherein:
the liner comprises a ceramic material.

8. A semiconductor processing chamber, comprising: a showerhead that at least partially defines a top of the chamber, the showerhead defining a plurality of apertures that extend through a thickness of the showerhead; a substrate support disposed beneath the showerhead, the substrate support comprising a support surface, wherein: a peripheral edge region of the support surface is recessed relative to a medial region of the support surface; and the substrate is vertically translatable within the chamber between a process position and a transfer position; a liner disposed laterally outward of and spaced apart from an exterior surface of the substrate support to define a purge lumen between the liner and the substrate support; wherein an inner surface of the liner comprises a protrusion that extends inward toward the exterior surface of the substrate support; a lateral distance between the exterior surface of the substrate support and the protrusion is between about 60 mils and 100 mils; and an edge ring seated on the peripheral edge region of the support surface when the substrate support is in the process position, the edge ring extending beyond a peripheral edge of the substrate support and above at least a portion of the liner, wherein: a gap is formed between a bottom surface of the edge ring and a top surface of the liner; and the gap and the purge lumen are fluidly coupled with one another.

9. The semiconductor processing chamber of claim 8, wherein:
the edge ring is seated on the top surface of the liner when the substrate support is in the transfer position.

10. The semiconductor processing chamber of claim 8, wherein:
a top surface of the edge ring and a top surface of the medial region of the support surface of the substrate support are at a substantially same height when the substrate support is in the process position.

11. The semiconductor processing chamber of claim 8, wherein:
the gap separates the bottom surface of the edge ring and the top surface of the liner by a vertical distance of between about 80 mils and 300 mils.

12. The semiconductor processing chamber of claim 8, further comprising:
a pumping liner radially outward of the liner.

13. The semiconductor processing chamber of claim 8, wherein:
one or both of an inner edge and an outer edge of the top surface of the liner are chamfered.

14. The semiconductor processing chamber of claim 8, further comprising:
a purge gas source coupled with a bottom of the purge lumen.

* * * * *